United States Patent
Douzaka et al.

(10) Patent No.: US 7,495,310 B2
(45) Date of Patent: Feb. 24, 2009

(54) FUSE-DATA READING CIRCUIT

(75) Inventors: Toshiaki Douzaka, Yokohama (JP); Shigeyuki Hayakawa, Yokosuka (JP); Yutaka Tanaka, Yokohama (JP); Tsuyoshi Midorikawa, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 291 days.

(21) Appl. No.: 11/138,712

(22) Filed: May 25, 2005

(65) Prior Publication Data

US 2005/0280495 A1 Dec. 22, 2005

(30) Foreign Application Priority Data

Jun. 22, 2004 (JP) ............... 2004-183768

(51) Int. Cl.
*H01L 23/62* (2006.01)

(52) U.S. Cl. ............. 257/529; 365/225.7; 257/E23.149

(58) Field of Classification Search .......... 257/E23.149, 257/209, 665, 528, 529; 365/225.7
See application file for complete search history.

(56) References Cited

U.S. PATENT DOCUMENTS

| | | | |
|---|---|---|---|
| 5,206,831 A * | 4/1993 | Wakamatsu | 365/200 |
| 5,780,918 A * | 7/1998 | Aoki | 257/529 |
| 5,789,970 A * | 8/1998 | Denham | 327/525 |
| 6,125,069 A * | 9/2000 | Aoki | 365/225.7 |
| 6,201,432 B1 | 3/2001 | Lim et al. | |
| 6,201,750 B1 * | 3/2001 | Busch et al. | 365/225.7 |
| 6,268,760 B1 * | 7/2001 | Marshall et al. | 327/525 |
| 6,278,298 B1 | 8/2001 | Hayakawa | |
| 6,294,841 B1 * | 9/2001 | Savignac et al. | 257/786 |
| 6,384,666 B1 | 5/2002 | Bertin et al. | |
| 6,430,101 B1 | 8/2002 | Toda | |
| 6,567,333 B2 | 5/2003 | Toda | |
| 6,839,298 B2 * | 1/2005 | Yung | 365/225.7 |
| 6,919,754 B2 * | 7/2005 | Kuroki | 327/525 |
| 7,129,769 B2 * | 10/2006 | Dixon et al. | 327/525 |
| 2002/0163343 A1 * | 11/2002 | Damon et al. | 324/550 |
| 2004/0257892 A1 * | 12/2004 | Hejdeman et al. | 365/201 |
| 2005/0247996 A1 * | 11/2005 | Chung et al. | 257/529 |

* cited by examiner

*Primary Examiner*—Jerome Jackson, Jr.
*Assistant Examiner*—Paul A Budd
(74) *Attorney, Agent, or Firm*—DLA Piper LLP (US)

(57) ABSTRACT

A fuse-data reading circuit is provided in a semiconductor integrated circuit device. In the fused-data reading circuit, a differential latch circuit compares a current depending on the resistance across a first fuse element, i.e., target element, with a current depending on the resistance of a series circuit including a second fuse element used as a reference fuse element and a resistor element. The differential latch circuit determines whether the first fuse element has been cut or not.

16 Claims, 5 Drawing Sheets

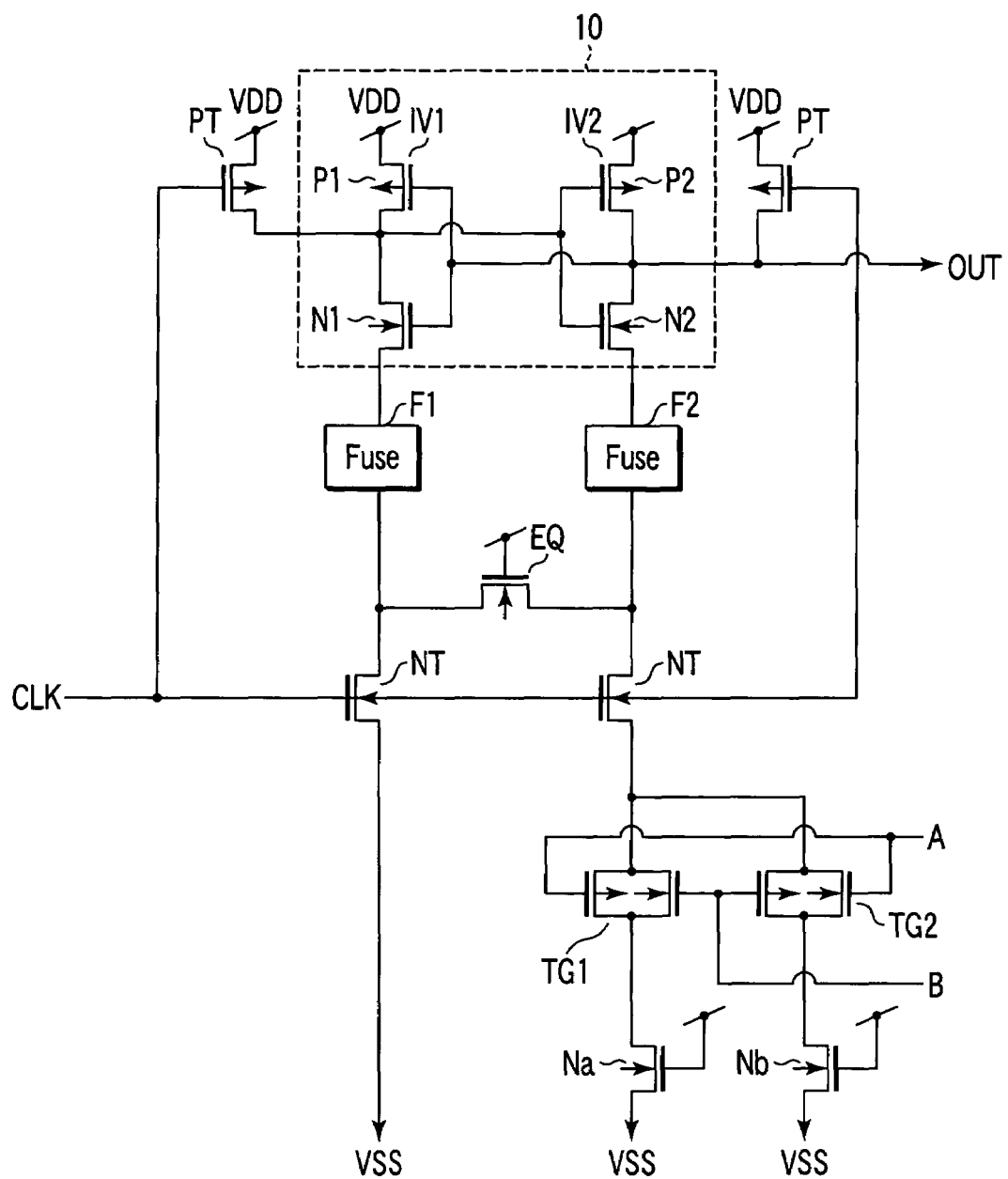
F I G. 7

FUSE-DATA READING CIRCUIT

CROSS-REFERENCE TO RELATED APPLICATIONS

This application is based upon and claims the benefit of priority from prior Japanese Patent Application No. 2004-183768, filed Jun. 22, 2004, the entire contents of which are incorporated herein by reference.

BACKGROUND OF THE INVENTION

1. Field of the Invention

The present invention relates to a circuit that reads the data about fuse elements. More particularly, the invention relates to a circuit that reads the data programmed in the fuse elements that are provided in, for example, the redundancy circuit of a semiconductor memory device.

2. Description of the Related Art

Two methods are known, which read the data programmed in the fuse elements provided in a semiconductor integrated circuit device. (The data represents whether the fuse elements are conductive or non-conductive.)

The first method is to detect a signal voltage that depends on whether a target fuse element is conductive or non-conductive. The first method is unreliable, however, because the semiconductor integrated circuit device has been manufactured in conditions different from those in which any other circuit has been made, the fuse elements have been cut in different states, the resistance of each non-conductive fuse element decreases with time, the resistance of each conductive fuse element increases with time, and so forth.

The second method is to detect the difference in two signal voltages that depend on a pair of fuse elements, one of which is the target fuse element. This method is disclosed in, for example, the specification of U.S. Pat. No. 6,201,432. Claim 9 in this U.S. patent describes a redundancy-address generating circuit that has a differential amplifier. The differential amplifier detects a difference between two signal voltages output from a pair of circuits, each comprising one fuse element and a resistor element connected in series to the fuse element. In the redundancy-address generating circuit, both fuse elements of the pair may be cut. Since two resistor elements are connected in series to the fuse elements, respectively, the circuit occupies a large area. This makes it impossible to determine how the resistance of each fuses element changes with time.

The specification of U.S. Pat. No. 6,384,666 discloses a system that can vary the threshold voltage of a latch circuit to 16 values in order to cancel out the resistance change that a fuse element undergoes as time passes. This system needs to have a control circuit for varying the threshold voltage. Its circuit configuration is inevitably complex. Consequently, it takes a long time to determine how the resistance of the fuse element changes with time.

BRIEF SUMMARY OF THE INVENTION

According to an aspect of the present invention, there is provided a fuse-data reading circuit comprising: a first fuse element which is programmed in accordance with data; a series circuit which includes a second fuse element and a resistance element connected in series to the second fuse element, the second fuse element remaining uncut and used as a reference fuse element; and a differential latch circuit which is connected to the first fuse element and the second fuse element, and which compares a current depending on a resistance of the first fuse element with a current depending on a resistance of the series circuit, thereby determining a programmed state of the first fuse element, and which outputs data representing the programmed state of the first fuse element.

BRIEF DESCRIPTION OF THE SEVERAL VIEWS OF THE DRAWING

FIG. 7 is a circuit diagram depicting another example of the fuse-data reading circuit shown in FIG. 5.

DETAILED DESCRIPTION OF THE INVENTION

Figure 1:
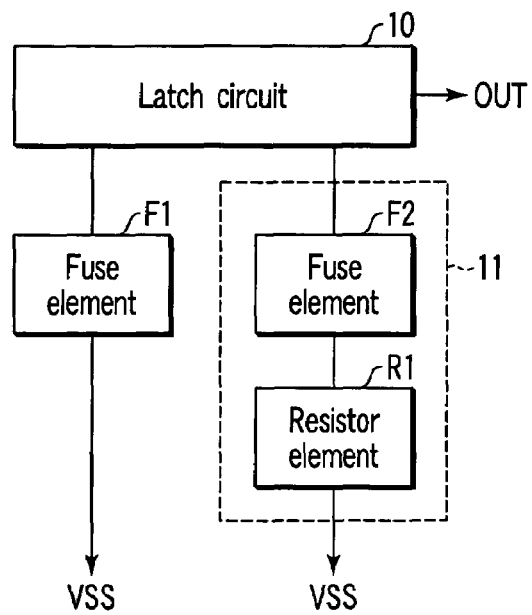
FIG. 1 is a block diagram of a fuse-data reading circuit according to a first-embodiment of this invention.

Embodiments of the present invention will be described in detail, with reference to the accompanying drawings. Any component of an embodiment, which is identical to its counterpart of any other embodiment, is designated at the same numeral in the drawings.

First Embodiment

FIG. 1 shows the major components of a fuse-data reading circuit according to the first embodiment of this invention. The fuse-data reading circuit is designed for use in a semiconductor integrated circuit device such as a semiconductor memory device. The fuse-data reading circuit comprises a differential latch circuit 10, fuse elements F1 and F2, and a resistor element R1. The differential latch circuit 10 has two input nodes and one output node. The first fuse element F1 is connected at one end to the first input node of the latch circuit 10, and at the other end to a node for applying reference voltage VSS. The first fuse element F1 is the target element in which data is programmed. The second fuse element F2 is provided to apply a reference voltage to the differential latch circuit 10. The resistor element R1 has a predetermined resistance. The second fuse element F2 and the resistor element R1 are connected in series, constituting a series circuit 11. The series circuit 11 is connected at one end to the other input node of the latch circuit 10, and at the other end to the node for applying reference voltage VSS. The resistor element R1 is one that can be formed on the silicon substrate of a semiconductor integrated circuit device. The resistor element R1 may be a MOS resistor, a polysilicon resistor, or the like.

The first fuse element F1 in which data is programmed and the second fuse element F2 for applying a reference voltage are identical in characteristics including parasitic resistance and parasitic capacitance. The fuse elements F1 and F2 may be fuses that can melt and be cut when applied with a laser beam, fuses that have their current characteristics changes when a voltage equal to or higher than a certain value is applied them, or fuses that can be cut when a current flows through them. It is desired that the region in which the first and second fuse elements F1 and F2 are provided be near the region in which the latch circuit 10 is provided. It is also desired that the fuse elements F1 and F2 be arranged symmetrical to the latch circuit 10. Then, the wiring distance between one end of the first fuse element F1 and one input node of the latch circuit 10 is short, and so is the wiring distance between one end of the second fuse element F2 and the other input node of the latch circuit 10.

The latch circuit 10 compares the current flowing in one input node with the current flowing in the other input node. Thus, the latch circuit 10 detects and latches the data programmed in the first fuse element F1. The data is then output from the latch circuit 10.

The resistance of the resistor element R1 provided in the series circuit 11 is much higher than the resistance F1on that the first fuse element F1 has before it is cut, and is much lower than the resistance F1off that the first fuse element F1 has after it is cut. Preferably, the resistance of the resistor element R1 is much lower than the resistance F1off even if it changes with time after the first fuse element F1 has been cut. The resistor element R1 has a resistance that is, for example, about half the resistance F1off. More specifically, the resistor element R1 has a resistance that satisfies two conditions. First, I1>I2 where I1 and I2 are currents flowing in the first fuse element F1 and the series circuit 11, respectively, before the first fuse element F1 is cut. Second, I1a<I2, where I1a and I2 are currents flowing in the first fuse element F1 after the first fuse element F1 has been cut.

While the fuse-data reading circuit is operating, two currents flow from the two input nodes of the latch circuit 10 through the first fuse element F1 and the series circuit 11, respectively. The difference between the currents flowing through the input nodes of the latch circuit 10 changes in polarity in accordance with the programmed state of the first fuse element F1, or in accordance with whether the first fuse element F1 has been cut or not. The latch circuit 10 detects the polarity of the current difference. The latch circuit 10 latches either a high (H) voltage or a low (L) voltage, depending on the polarity it has detected. The latch circuit 10 outputs the high or low voltage as output data OUT.

Figure 2:
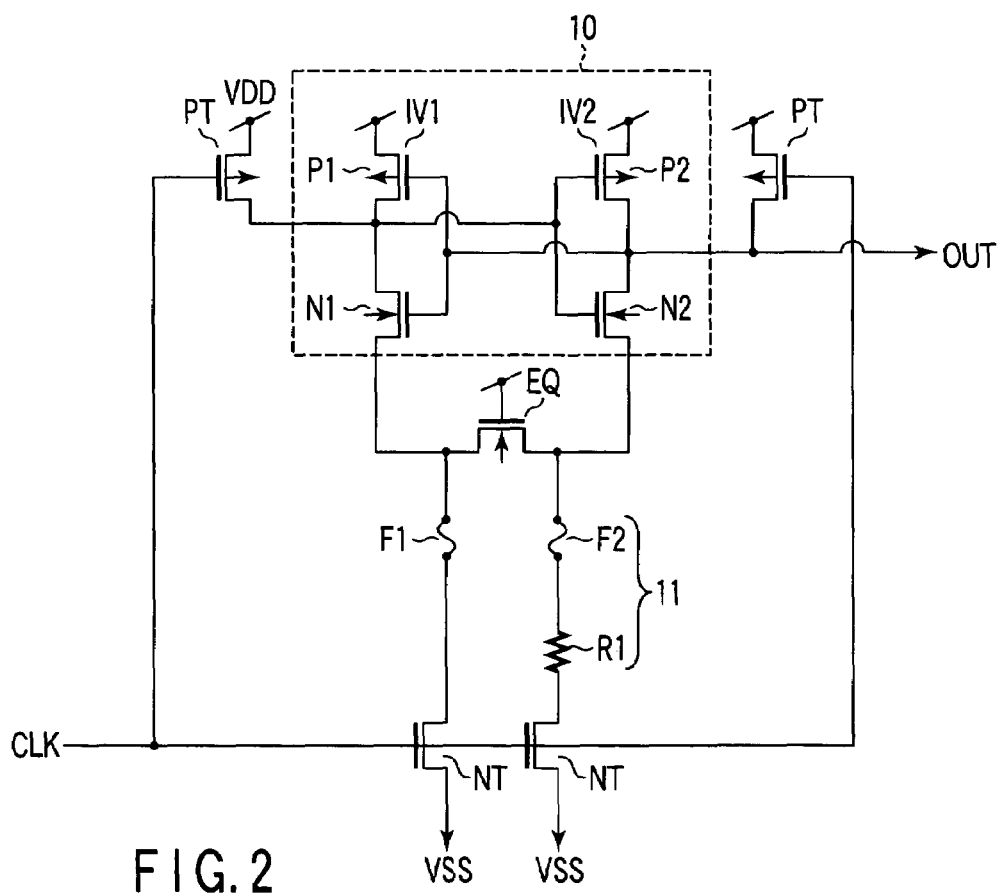
FIG. 2 is a circuit diagram illustrating an example of the fuse-data reading circuit shown in FIG. 1.

FIG. 2 depicts the circuit configuration of the fuse-data reading circuit shown in FIG. 1. The latch circuit 10 of the fuse-data reading circuit includes two CMOS inverter circuits IV1 and IV2. One output node of the first CMOS inverter circuit IV1 is connected to the output node of the second CMOS inverter circuit IV2, and one output node of the second CMOS inverter circuit IV2 is connected to the output node of the first CMOS inverter circuit IV1. Thus, the CMOS inverter circuits IV1 and IV2 constitute a CMOS latch circuit.

The first CMOS inverter circuit IV1 comprises a P-channel MOS transistor P1 and an N-channel MOS transistor N1. The source of the MOS transistor P1 is connected to the node for applying power-supply voltage VDD. The drain of the MOS transistor N1 is connected to the drain of the MOS transistor P1. The common drain node to the MOS transistors P1 and N1 serves as output node of the first CMOS inverter circuit IV1. The gate electrodes of the MOS transistors P1 and N1 are connected to each other, forming common gate node. The common gate node serves as the input node of the first CMOS inverter circuit IV1.

The second CMOS inverter circuit IV2 comprises a P-channel MOS transistor P2 and an N-channel MOS transistor N2. The source of the MOS transistor P2 is connected to the node for applying power-supply voltage VDD. The drains of the MOS transistors N2 and P2 are connected to each other, providing common drain node. The common drain node functions as output node of the second CMOS inverter circuit IV2. The gate electrodes of the MOS transistors P2 and N2 are connected to each other, forming common gate node. The common gate node is used as input node of the second CMOS inverter circuit IV2.

The sources of the MOS transistors N1 and N2 function as two input nodes of the latch circuit 10.

The fuse-data reading circuit further includes two P-channel MOS transistors PT for controlling activation. One of the P-channel MOS transistors PT is connected between the output node of the first CMOS inverter circuit IV1 and the node for applying power-supply voltage VDD. The other P-channel MOS transistors PT is connected between the output node of the second CMOS inverter circuit IV2 and the node for applying power-supply voltage VDD. The output node of one CMOS inverter circuit serves as the output node OUT of the latch circuit 10. In the present embodiment, the output node of the second CMOS inverter circuit IV2 is used as the output node OUT.

An N-channel MOS transistor EQ is connected between the sources of the N-channel MOS transistors N1 and N2 to equalize the potentials at the input nodes of the latch circuit 10. The gate electrode of the MOS transistor EQ is connected to the node for applying power-supply voltage VDD. Thus, the MOS transistor EQ always remains on.

The first fuse element F1 is connected at one end to one input node of the latch circuit 10. Between the other end of the first fuse element F1 and the node for applying ground voltage VSS, an N-channel MOS transistor NT is connected to control activation. The series circuit 11 is connected at one end to the other input node of the latch circuit 10. Between the other end of the series circuit 11 and the node for applying ground voltage VSS, an N-channel MOS transistor NT to control activation is inserted.

A control signal CLK is supplied to the gate electrodes of the activation-controlling transistors PT and activation-controlling transistors NT. When the control signal CLK is at "L" level, the P-channel MOS transistors PT are on, whereby the output nodes of the CMOS inverter circuits IV1 and IV2 of the latch circuit 10 are pre-charged to power-supply voltage VDD. When the control signal CLK is at "H" level, the N-channel MOS transistors NT are on. In this case, two currents corresponding to the resistance of the first fuse element F1 and the resistance of the series circuit 11, respectively, flow to the two input nodes of the latch circuit 10.

In the fuse-data reading circuit of FIG. 2, the first fuse element F1 may not be cut and may thus be programmed. If this is the case, when the control signal CLK rises to "H" level, a current I1 that corresponds to the resistance F1on of the first fuse element F1 flows through the first fuse element F1, and a current I2 that corresponds to the resistance of the series circuit 11 flows through the series circuit 11. The resistor element R1 of the series circuit 11 has such resistance that the current I1 is larger than the current I2, i.e., I1>I2. Therefore, a potential difference develops between the input nodes of the latch circuit 10. In accordance with the polarity of this potential difference, data representing "H"-level voltage or "L"-level voltage is output from the output node of the latch circuit 10.

Instead, the first fuse element F1 may be so programmed that it has already been cut. In this case, when the control signal CLK rises to "H" level, a current I1a that corresponds to the resistance of the first fuse element F1 flows through the first fuse element F1, and a current I2 that corresponds to the resistance of the series circuit 11 flows through the series circuit 11. The resistor element R1 of the series circuit 11 has such resistance that the current I1a is smaller than the current I2, i.e., I1a<I2. The potential difference between the input nodes of the latch circuit 10 therefore has polarity inverse to the polarity it has if the first fuse element F1 has not been cut. In accordance with the polarity of this potential difference, data representing "L"-level voltage or "H"-level voltage is output from the output node of the latch circuit 10.

In the fuse-data reading circuit that is the first embodiment of the invention, the latch circuit 10 compares the current that depends on the resistance of the first fuse element F1, i.e., target fuse element, with the current that depends on the resistance of the series circuit 11 including the second fuse element F2 that applies the reference voltage. The latch circuit 10 can therefore determine whether the first fuse element F1 has been cut or not, thus detecting and outputting the data programmed in the first fuse element F1.

As indicated above, the first and second fuse elements F1 and F2 are identical in characteristics including parasitic resistance and parasitic capacitance. Hence, the latch circuit 10 detects only the difference in current, which results from the resistance change that is determined in accordance with whether the first fuse element F1 has been cut or not. The latch circuit 10 can therefore accurately determine whether the first fuse element F1 has been cut or not. In addition, the fuse-data reading circuit is simple, comprising only two fuse elements F1 and F2, resistor element R1 and differential latch circuit 10.

Figure 3:
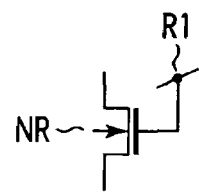
FIG. 3 is a circuit diagram of a resistor element that may be used in the fuse-data reading circuit of FIG. 2.

The resistor element R1 shown in FIG. 2 may be an N-channel MOS transistor NR, as is illustrated in FIG. 3. As FIG. 3 shows, the N-channel MOS transistor NR has its gate electrode connected to the node for applying power-supply voltage VDD.

Figure 4:
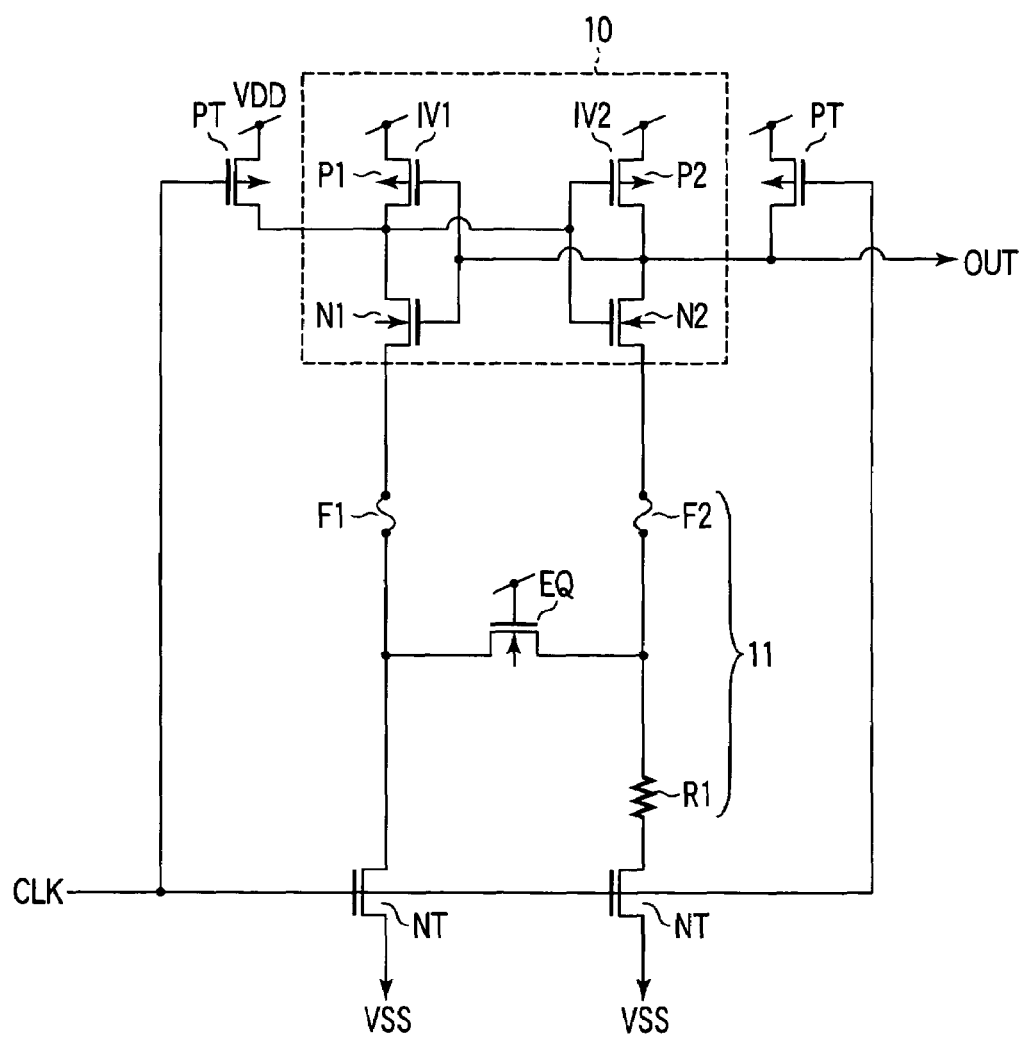
FIG. 4 is a circuit diagram illustrating another example of the fuse-data reading circuit shown in FIG. 1.

FIG. 4 illustrates the circuit configuration of another example of the fuse-data reading circuit shown in FIG. 1. In the fuse-data reading circuit of FIG. 2, the N-channel MOS transistor EQ, which equalizes the potentials at the input nodes of the latch circuit 10, is connected between the sources of the N-channel MOS transistors N1 and N2. By contrast, in the fuse-data reading circuit of FIG. 4, the N-channel MOS transistor EQ is connected between the other end of the first fuse element F1 and the other end of the second fuse element F2. Although the fuse-data reading circuit of FIG. 4 differs in this respect, it can attain the same advantage as the circuit shown in FIG. 2.

Second Embodiment

Figure 5:
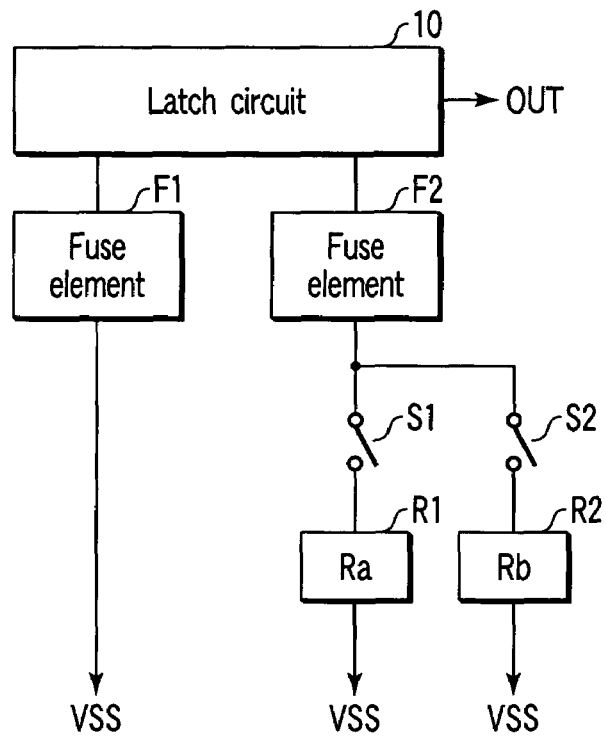
FIG. 5 is a block diagram of a fuse-data reading circuit according to a second embodiment of the invention.

FIG. 5 depicts a fuse-data reading circuit according to the second embodiment of the present invention. This fuse-data reading circuit is for use in a semiconductor integrated circuit device such as a semiconductor memory device. The fuse-data reading circuit of FIG. 5 differs from the circuit of FIG. 1 in that a plurality of resistor elements, for example, two resistor elements R1 and R2, is connected in series to the second fuse element F2. A plurality of switch elements, for example, two switch elements S1 and S2, is connected in series to the two resistor elements R1 and R2, respectively. The switch element S1 or the switch element S2 is selected in accordance with, for example, a test-mode signal. In any other respects, the circuit of FIG. 5 is identical to the circuit of FIG. 1. The components identical to those shown in FIG. 1 will not be described in detail. Note that the switch elements S1 and S2 may be, for example, MOS transistors, transfer gates, or the like.

More precisely, the first and second switch elements S1 and S2 are connected at one end to the other end of the second fuse element F2, which is connected to one input node of the latch circuit 10 to apply the reference voltage to the latch circuit 10. The first resistor element R1 that has first resistance Ra is connected between the other end of the first switch element S1 and the node for applying ground voltage VSS. Similarly, the second resistor element R2 that has second resistance Rb is connected between the other end of the second switch element S2 and the node for applying ground voltage VSS. The resistor elements R1 and R2 may be formed on the silicon substrate of a semiconductor integrated circuit device. They are, for example, MOS resistors or polysilicon resistors.

In the fuse-data reading circuit of FIG. 5, which is the second embodiment of the invention, the switch element S1 connects the first resistor element R1 to the second fuse element F2, the switch element S2 connects the second resistor element R2 to the second fuse element F2. If the first resistor element R1 having first resistance Ra is selected, the latch circuit 10 compares the current depending on the resistance across the first fuse element F1 (i.e., target fuse element) with the current depending on the resistance of the series circuit composed of the second fuse element F2 (i.e., fuse element for applying the reference voltage) and first resistor element R1 (having resistance Ra), as in the first embodiment. Thus, the latch circuit 10 can accurately determine whether the first fuse element F1 has been cut or not. Since the first and second fuse elements F1 and F2 are identical in characteristics including parasitic resistance and parasitic capacitance, the latch circuit 10 detects only the difference in current, which results from the resistance change that is determined in accordance with whether the first fuse element F1 has been cut or not. This is why the latch circuit 10 can reliably determine whether the first fuse element F1 has been cut or not.

If the first fuse element F1 (i.e., target fuse element) has been cut, its resistance decreases changes with time after the integrated circuit device incorporating the fuse-data reading circuit is used for a predetermined time. Even in this case, the latch circuit 10 can correctly determine whether the first fuse element F1 has been cut by comparing the current depending on the resistance of the first fuse element F1 with the current depending on the resistance of the series circuit composed of the second fuse element F2 (i.e., fuse element for applying the reference voltage) and second resistor element R2 (having resistance Rb). If the resistance Rb of the second resistor element R2 is set to an appropriate value, the latch circuit 10 can determine whether the first fuse element F1 has been cut or not, even if the resistance of the first fuse element F1 decreases with time after the integrated circuit device is used for a predetermined time.

Moreover, the fuse-data reading circuit according to the second embodiment can determine whether the first fuse element F1 has been cut or not, though it is relatively simple, comprising only the fuse elements F1 and F2, resistor elements R1 and R2 and differential latch circuit 10.

Figure 6:
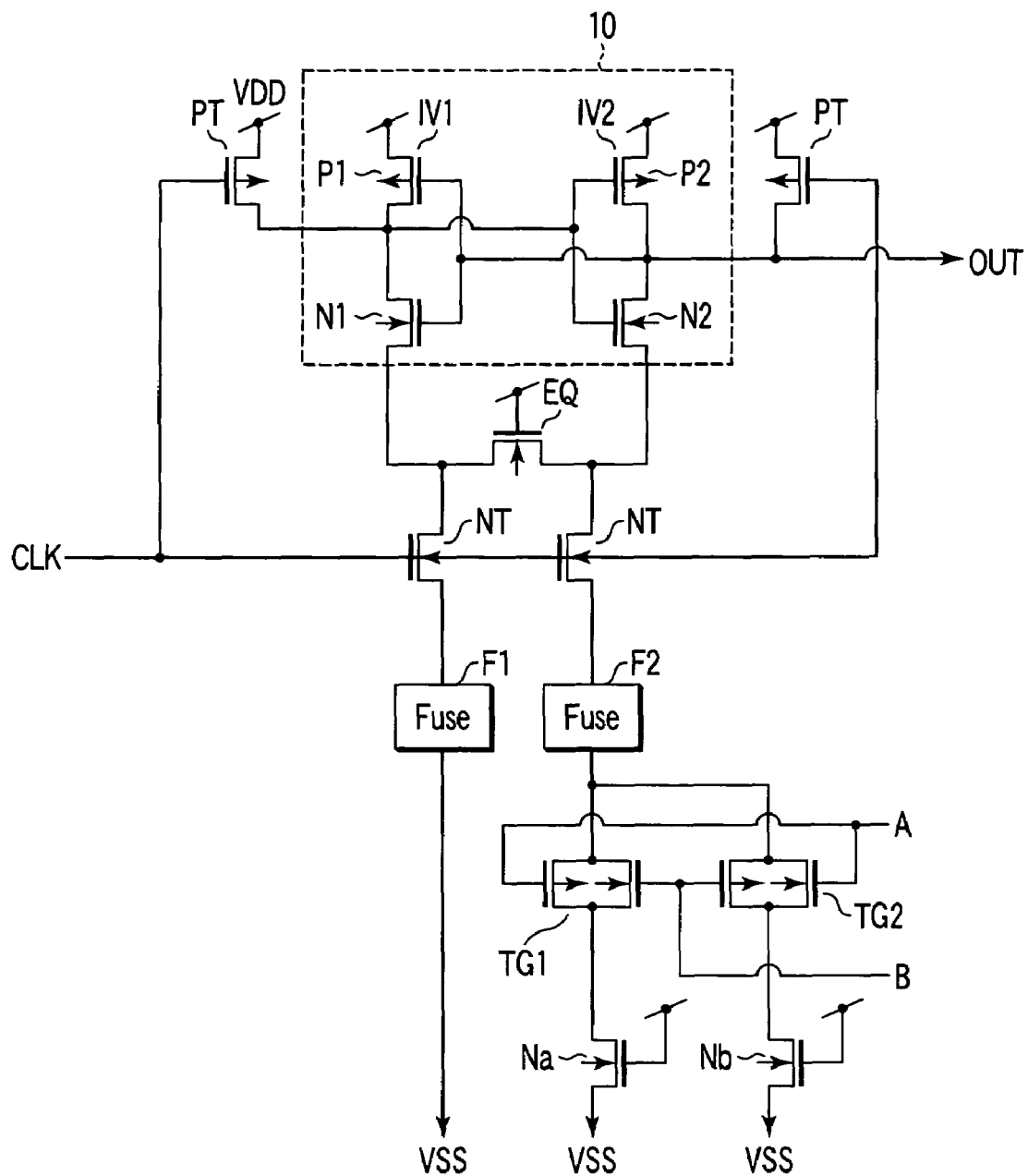
FIG. 6 is a circuit diagram illustrating an example of the fuse-data reading circuit shown in FIG. 5.

FIG. 6 shows a circuit configuration that the fuse-data reading circuit of FIG. 5 may have. The components identical to those shown in FIG. 2 are designated at the same reference numerals and will not be described in detail.

The switch elements S1 and S2 are CMOS transfer gates TG1 and TG2, respectively. Each of the transfer gates TG1 and TG2 comprises a P-channel MOS transistor and an N-channel MOS transistor, the source-drain paths of which are connected to each other. The P-channel MOS transistor and N-channel MOS transistor of each transfer gate are turned on or off by control signals A and B, respectively. The resistor elements R1 and R2 are constituted by N-channel MOS transistors Na and Nb, respectively. The N-channel MOS transistors Na and Nb are connected to the node for applying power-supply voltage VDD.

In the second embodiment, an N-channel MOS transistor NT for controlling activation is connected between one input node of the latch circuit 10 and one end of the first fuse element F1, and another N-channel MOS transistor NT for controlling activation is connected between the other input node of the latch circuit 10 and one end of the second fuse element F2. Instead, the first MOS transistor NT may be connected between the other end of the first fuse element F1 and the node for applying ground voltage VSS, and the second MOS transistor NT may be connected between the other end of the second fuse element F2, on the one hand, and the switch elements S1 and S2, on the other hand.

FIG. 7 shows another circuit configuration that the fuse-data reading circuit shown of FIG. 5 may have. In the fuse-data reading circuit of FIG. 6, the N-channel MOS transistor EQ, which equalizes the potentials at the input nodes of the latch circuit 10, is connected between the source of the N-channel MOS transistor N1 and the source of the N-channel MOS transistor N2. In the fuse-data reading circuit of FIG. 7, the N-channel MOS transistor EQ is connected between the other end of the first fuse element F1 and the other end of the second fuse element F2. Although the circuit shown in FIG. 7 differs from the circuit of FIG. 6 in this respect, it achieves the same advantages as the circuit of FIG. 6.

Figure 8:
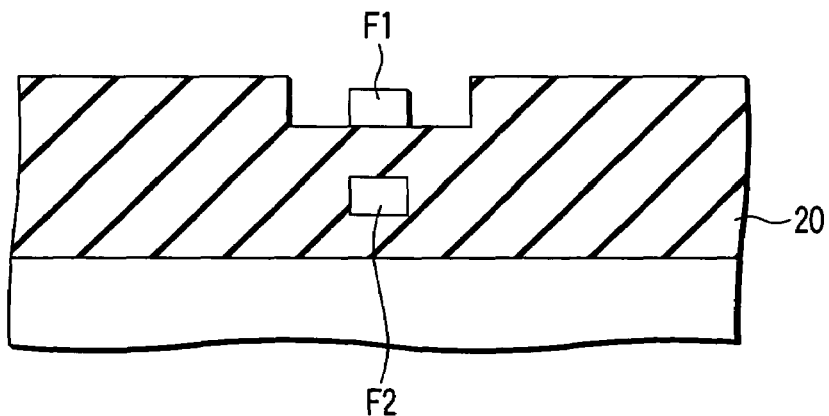
FIG. 8 is a sectional view depicting the structure of the identical fuse elements that are used in the fuse-data reading circuit according to the first and second embodiments.

FIG. 8 depicts a structure that the first and second fuse elements F1 and F2 may have in the first and second embodiments. The second fuse element F2 will not be programmed. That is, it will not be cut at all. Therefore, the second fuse element F2 is therefore provided in an insulating film 20 that is provided on a semiconductor substrate. By contrast, the first fuse element F1 will be programmed, or be cut. It is therefore exposed, formed on the insulating film 20. As FIG. 8 shows, the first fuse element F1 overlaps the second fuse element F2. Thus, the fuse elements F1 and F2 occupy a smaller area than otherwise. The first and second fuse elements F1 and F2 may be elements that can be melted and cut when applied with a laser beam. Alternatively, they may be elements whose current characteristic changes when applied with a voltage of equal to or higher than a certain value. The fuse elements F1 and F2 may be made of, for example, polysilicon or metal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fuse-data reading circuit comprising:
   a programmable fuse element;
   a series circuit which includes a reference fuse element and a resistance element connected in series to the reference fuse element, the reference fuse element remaining uncut; and
   a differential latch circuit, including a first input node to which the programmable fuse element is connected and a second input node to which the series circuit is connected, the differential latch circuit causing a first current to flow through the programmable fuse element in accordance with a resistance of the programmable fuse element and causing a second current to flow through the series circuit in accordance with a resistance of the series circuit, the differential latch circuit comparing the first current with the second current, thereby determining a programmed data of the programmable fuse element, and which outputs data representing the programmable data of the programmable fuse element;
   wherein the resistance of the resistor element is higher than the resistance that the programmable fuse element has while remaining uncut, and is lower than the resistance that the programmable fuse element has after having been cut.

2. A fuse-data reading circuit comprising:
   a programmable fuse element;
   a series circuit which includes a reference fuse element and a resistance element connected in series to the reference fuse element, the reference fuse element remaining uncut; and
   a differential latch circuit, including a first input node to which the programmable fuse element is connected and a second input node to which the series circuit is connected, the differential latch circuit causing a first current to flow through the programmable fuse element in accordance with a resistance of the programmable fuse element and causing a second current to flow through the series circuit in accordance with a resistance of the series circuit, the differential latch circuit comparing the first current with the second current, thereby determining a programmed data of the programmable fuse element, and which outputs data representing the programmable data of the programmable fuse element;
   wherein the resistor element includes a MOS transistor.

3. A fuse-data reading circuit comprising:
   a programmable fuse element;
   a series circuit which includes a reference fuse element and a resistance element connected in series to the reference fuse element, the reference fuse element remaining uncut; and
   a differential latch circuit. including a first input node to which the programmable fuse element is connected and a second input node to which the series circuit is connected, the differential latch circuit causing a first current to flow through the programmable fuse element in accordance with a resistance of the programmable fuse element and causing a second current to flow through the series circuit in accordance with a resistance of the series circuit, the differential latch circuit comparing the first current with the second current, thereby determining a programmed data of the programmable fuse element, and which outputs data representing the programmable data of the programmable fuse element;
   wherein the reference fuse element is provided in an insulating film that is provided on a semiconductor substrate, and the programmable fuse element is provided on the insulating film and overlaps the reference fuse element.

4. A fuse-data reading circuit comprising:
   a programmable fuse element;
   a series circuit which includes a reference fuse element and a resistance element connected in series to the reference fuse element, the reference fuse element remaining uncut; and
   a differential latch circuit, including a first input node to which the programmable fuse element is connected and a second input node to which the series circuit is connected, the differential latch circuit causing a first current to flow through the programmable fuse element in accordance with a resistance of the programmable fuse element and causing a second current to flow through the series circuit in accordance with a resistance of the series circuit, the differential latch circuit comparing the first current with the second current, thereby determining a programmed data of the programmable fuse element, and which outputs data representing the programmable data of the programmable fuse element;

wherein the differential latch circuit includes:
a first MOS transistor of first polarity type, which has a current path and a gate electrode, the current path being connected at one end to a first power-supply node;
second MOS transistor of second polarity type, which has a current path and a gate electrode, the current path being connected at one end to the other end of the current path of the first MOS transistor, and at the other end to the programmable fuse element, and the gate electrode being connected to the gate electrode of the first MOS transistor;
a third MOS transistor of first polarity type, which has a current path and a gate electrode, the current path being connected at one end to the first power-supply node; and
a fourth MOS transistor of second polarity type, which has a current path and a gate electrode, the current path being connected at one end to the other end of the current path of the third MOS transistor, and at the other end to the series circuit, and the gate electrode being connected to the gate electrode of the third MOS transistor.

5. The circuit according to claim 4, further comprising a fifth MOS transistor of second polarity type, which has a current path and a gate electrode, the current path being inserted between the other ends of the second and fourth MOS transistors, and the fifth MOS transistor being an equalizing transistor.

6. The circuit according to claim 4, further comprising:
an sixth MOS transistor of first polarity type, which has a current path and a gate electrode, the current path being connected in one end to the first power-supply node, and at the other end to a common connecting node provided at the other ends of the current paths of the first and second MOS transistors, and the gate electrode being connected to receive a control signal; and
a seventh MOS transistor of first polarity type, which has a current path and a gate electrode, the current path being connected at one end to the first power-supply node, and at the other end to a common connecting node provided at the other ends of the third and fourth MOS transistors, and the gate electrode being connected to receive the control signal.

7. The circuit according to claim 5, further comprising:
an eighth MOS transistor of second polarity type, which has a current path and a gate electrode, the current path being connected in series to the programmable fuse element, and the gate electrode being connected to receive the control signal; and
a ninth MOS transistor of second polarity type, which has a current path and a gate electrode, the current path being connected in series to the series circuit, and the gate electrode being connected to receive the control signal.

8. A fuse-data reading circuit comprising:
a first fuse element which is programmed in accordance with data;
a second fuse element which is used as a reference fuse element, the second fuse element remains uncut;
first and second switch elements, each of which has a first end and a second end and is connected at one end to the second fuse element, either the first switch element or the second switch elements being selected to be conductive;
a first resistor element which is connected to the other end of the first switch element;
a second resistor element which is connected to the other end of the second switch element; and
a differential latch circuit which is connected to the first fuse element and the second fuse element, and which compares a current depending on a resistance of the first fuse element with a current depending on a resistance of the second fuse element and a resistance of the first or second resistor element, thereby determining a programmed state of the first fuse element, and which outputs data representing the programmed state of the first fuse element.

9. The circuit according to claim 8, wherein the first and second resistor elements have a resistance which is higher than the resistance that the first fuse element has while remaining uncut, and is lower than the resistance that the first fuse element has after having been cut.

10. The circuit according to claim 9, wherein the first and second resistor elements have different resistances.

11. The circuit according to claim 8, wherein the first and second resistor elements include a MOS transistor.

12. The circuit according to claim 8, wherein the second fuse element is provided in an insulating film that is provided on a semiconductor substrate, and the first fuse element is provided on the insulating film and overlaps the second fuse element.

13. The circuit according to claim 8, wherein the differential latch circuit includes:
a first MOS transistor of first polarity type, which has a current path and a gate electrode, the current path being connected at one end to a first power-supply node;
a second MOS transistor of second polarity type, which has a current path and a gate electrode, the current path being connected at one end to the other end of the current path of the first MOS transistor, and at the other end to the first fuse element, and the gate electrode being connected to the gate electrode of the first MOS transistor;
a third MOS transistor of first polarity type, which has a current path and a gate electrode, the current path being connected at one end to the first power-supply node; and
a fourth MOS transistor of second polarity type, which has a current path and a gate electrode, the current path being connected at one end to the other end of the current path of the third MOS transistor, and at the other end to the series circuit, and the gate electrode being connected to the gate electrode of the third MOS transistor.

14. The circuit according to claim 13, further comprising a fifth MOS transistor of second polarity type, which has a current path and a gate electrode, the current path being inserted between the other ends of the second and fourth MOS transistors, and the fifth MOS transistor being an equalizing transistor.

15. The circuit according to claim 13, further comprising:
a sixth MOS transistor of first polarity type, which has a current path and a gate electrode, the current path being connected at one end to the first power-supply node, and at the other end to a common connecting node provided at the other ends of the current paths of the first and second MOS transistors, and the gate electrode being connected to receive a control signal; and
a seventh MOS transistor of first polarity type, which has a current path and a gate electrode, the current path being connected at one end to the first power-supply node, and at the other end to a common connecting node provided at the other ends of the third and fourth MOS transistors, and the gate electrode being connected to receive the control signal.

16. The circuit according to claim 13, further comprising:
an eighth MOS transistor of second polarity type, which has a current path and a gate electrode, the current path being connected in series to the first fuse element, and the gate electrode being connected to receive the control signal; and
a ninth MOS transistor of second polarity type, which has a current path and a gate electrode, the current path being connected in series to the series circuit, and the gate electrode being connected to receive the control signal.

* * * * *